(12) United States Patent
Scharf et al.

(10) Patent No.: US 11,469,161 B2
(45) Date of Patent: Oct. 11, 2022

(54) LEAD FRAME-BASED SEMICONDUCTOR PACKAGE

(71) Applicant: Infineon Technologies AG, Neubiberg (DE)

(72) Inventors: Thorsten Scharf, Regensburg (DE); Chan Lam Cha, Melaka (MY); Wolfgang Hetzel, Nattheim (DE); Swee Kah Lee, Melaka (MY); Stefan Macheiner, Kissing (DE)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 17/004,070

(22) Filed: Aug. 27, 2020

(65) Prior Publication Data

US 2022/0068773 A1 Mar. 3, 2022

(51) Int. Cl.
| | |
|---|---|
| *H01L 23/495* | (2006.01) |
| *H01L 23/00* | (2006.01) |
| *H01L 23/31* | (2006.01) |
| *H01L 21/48* | (2006.01) |

(52) U.S. Cl.
CPC .... *H01L 23/49548* (2013.01); *H01L 23/3107* (2013.01); *H01L 23/4951* (2013.01); *H01L 24/08* (2013.01); *H01L 24/09* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 24/97* (2013.01); *H01L 21/4828* (2013.01); *H01L 21/4842* (2013.01); *H01L 2224/08057* (2013.01); *H01L 2224/32105* (2013.01); *H01L 2224/32258* (2013.01); *H01L 2224/48105* (2013.01); *H01L 2224/48245* (2013.01); *H01L 2224/73265* (2013.01); *H01L 2224/92247* (2013.01)

(58) Field of Classification Search
CPC .......... H01L 23/49548; H01L 23/3107; H01L 23/4951; H01L 24/08; H01L 24/09; H01L 24/32; H01L 24/48; H01L 24/73; H01L 24/83; H01L 24/85; H01L 24/92; H01L 24/97
See application file for complete search history.

(56) References Cited

U.S. PATENT DOCUMENTS 8,217,281 B2 * 7/2012 Van Gemert ..... H01L 23/49541
174/528

* cited by examiner

*Primary Examiner* — Jasmine J Clark
(74) *Attorney, Agent, or Firm* — Murphy, Bilak & Homiller, PLLC (57) ABSTRACT

A semiconductor package includes: a lead frame having a plurality of blocks of uniform size and laterally spaced apart from one another with uniform spacing; a first semiconductor die attached to a first group of the blocks; electrical conductors connecting a plurality of input/output (I/O) terminals of the first semiconductor die to a second group of the blocks, at least some blocks of the second group being laterally spaced outward from the blocks of the first group; and a mold compound encapsulating the first semiconductor die and the electrical conductors. Corresponding methods of producing the semiconductor package are also described.

23 Claims, 5 Drawing Sheets

LEAD FRAME-BASED SEMICONDUCTOR PACKAGE

BACKGROUND

Many types of power semiconductor packages include logic circuitry that require input/output (I/O) connections which are separate from power and ground connections. Such power semiconductor packages are typically lead frame-based and have standard I/O pin counts such as 48, 64, etc. This means that the size of a standard power semiconductor package with logic circuitry increases significantly for small I/O pin count changes. Take, for example, a power semiconductor package having a standard I/O pin count of 48. By adding a single I/O pin to the package design, the size of the package increases dramatically from a standard 48 pin count package to a standard 64 pin count package which is wasteful. Also, different lead frame designs are typically used for different power semiconductor package types.

Thus, there is a need for a power semiconductor package technology that accommodates different I/O pin counts without requiring large increases in package size or different lead frame designs.

SUMMARY

According to an embodiment of a semiconductor package, the semiconductor package comprises: a lead frame comprising a plurality of blocks of uniform size and laterally spaced apart from one another with uniform spacing; a first semiconductor die attached to a first group of the blocks; electrical conductors connecting a plurality of input/output (I/O) terminals of the first semiconductor die to a second group of the blocks, at least some blocks of the second group being laterally spaced outward from the blocks of the first group; and a mold compound encapsulating the first semiconductor die and the electrical conductors.

According to an embodiment of a method of producing a semiconductor package, the method comprises: providing a lead frame comprising a common base and a plurality of blocks of uniform size and laterally spaced apart from one another with uniform spacing, the blocks extending from the common base in a direction perpendicular to the lateral spacing between the blocks; attaching a first semiconductor die to a first group of the blocks; connecting a plurality of input/output (I/O) terminals of the first semiconductor die to a second group of the blocks, at least some blocks of the second group being laterally spaced outward from the first group of blocks; encapsulating the first semiconductor die and the connections between the I/O terminals and the second group of blocks in a mold compound; and after the encapsulating, removing the common base of the lead frame or severing the common base at least between the blocks of the second group that are connected to different electric potentials or to different signals.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a power semiconductor package technology that easily adapts to package I/O terminal count. The I/O terminals, also referred to herein as I/O pins, of a power semiconductor package are the part of the package used primarily for making an electrical connection other than power and ground. Power and ground connections are provided by separate terminals. In the case of a lead frame-based package, the I/O terminals are implemented by the leads of a lead frame. The term 'lead frame' as used herein refers to the metal structures inside a semiconductor package that carry signals from the semiconductor die to the outside. Lead frames may be manufactured as part of a panel, where individual lead frames are secured as units to a periphery region by connecting structures. The connecting structures are subsequently severed, e.g., after molding to yield individual packages. An individual package may include more than one lead frame, depending on the type of device included in the package.

The power semiconductor package lead frames described herein include blocks of uniform size which are laterally spaced apart from one another with uniform spacing. These blocks are used to implement I/O terminals, power and ground terminals, and for semiconductor die (chip) attachment. With such a lead frame configuration, the same lead frame design may be used to accommodate semiconductor dies of different sizes and different I/O terminal counts without requiring a redesign of the lead frame. Bigger semiconductor dies occupy more blocks and smaller semiconductor dies occupy fewer blocks. Accordingly, the lead frame design is independent of die design and the final package size depends on the size and I/O terminal count of the semiconductor die(s) included in each package.

The power semiconductor package technology described herein provides a fully scalable footprint, quantized only by pitch. A single lead frame design may accommodate different types of products, and the lead frames may be part of a lead frame panel so that hundreds or even thousands of packaged devices may be accommodated per panel. Different products may be accommodated on the same panel. Accordingly, the same base (lead frame) material and same process flow may be used for all products. A lead frame panel may have the same feature spacing throughout, but may be divided into sections of different sizes. For example, one section of the panel may define 5×6 mm lead frames and another may define 8×8 mm lead frames. After package forming, a single cut between the two sections can then be followed by individual package dicing.

Also, flip-chip assembly is possible with limited fan-out capability. For example, solder resist may be used to define a half redistribution layer to enable limited routing. Insulation may be provided on some parts to ensure these parts do not come into contact with electrical wiring on the system board except where a connection is desired. A blanket insulator such as solder resist or any other protection layer may be provided and opened only at positions where an electrical connection is desired. Solder resist may be applied by curtain flow, printing, etc. followed by exposure and development. Solder resist may instead be applied by inkjet printing or stencil printing. Applying solder deposit to exposed areas yields a positive standoff.

Multi-die packages are also possible with the power semiconductor package technology described herein. The uniformly sized blocks of the lead frame may have any shape such as, e.g., L-shape or T-shape. The blocks to which a semiconductor die is attached may be connected. In corners of the package, the blocks, i.e. corner blocks, may be combined. An additional solder deposit may be provided to ease customer assembly, e.g., solder balls or land grid array area contacts. Passive device integration inside the package also is possible. Re-routing may be implemented with additional electrical interconnects from one block to another block. For example, every nth block may be connected to ground. Accordingly, block positions may be changed via routing instead of a physical change to the lead frame design. Interconnections also may be provided between raised blocks of the lead frame.

Described next, with reference to the figures, are exemplary embodiments of the power semiconductor package technology.

Figure 1A:
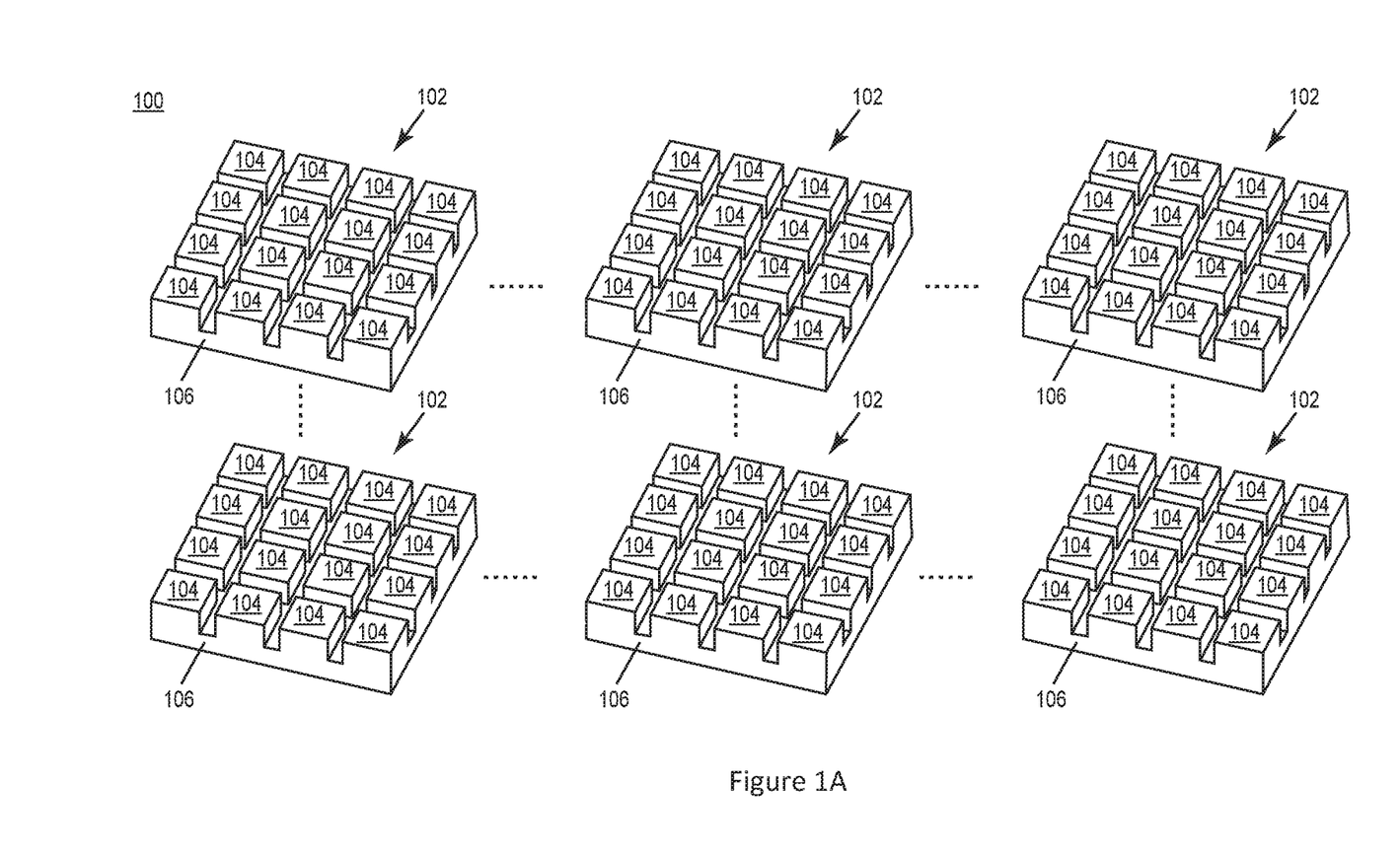
FIG. 1A shows a side perspective view of a lead frame panel that includes a plurality of lead frames having blocks of uniform size and that are laterally spaced apart from one another with uniform spacing.

FIG. 1A shows a side perspective view of a lead frame panel 100 that includes a plurality of lead frames 102. The lead frame panel 100 may have any desired size, e.g., 70×250 mm, 100×300 mm, 500×500 mm, 600×600 mm, etc. While shown as being spaced apart from one another in FIG. 1, the lead frames 102 form an integral part of the lead frame 100 and are interconnected to one another as indicated by the horizontal and vertical dashed lines. That is, in FIG. 1, the lead frames 100 have yet to be separated (singulated) from one another.

The lead frame panel 100 may be formed from a metal sheet, and the lead frame features described herein may be formed using typical techniques such as stamping, punching, etching, etc. Exemplary materials for the lead frame panel 100 include, but are not limited to, metals such as copper, aluminum, nickel, iron, zinc, etc., and alloys thereof. Each the lead frame 102 included in the lead frame panel 100 has blocks 104 of uniform size and that are laterally spaced apart from one another with uniform spacing.

Figure 1B:
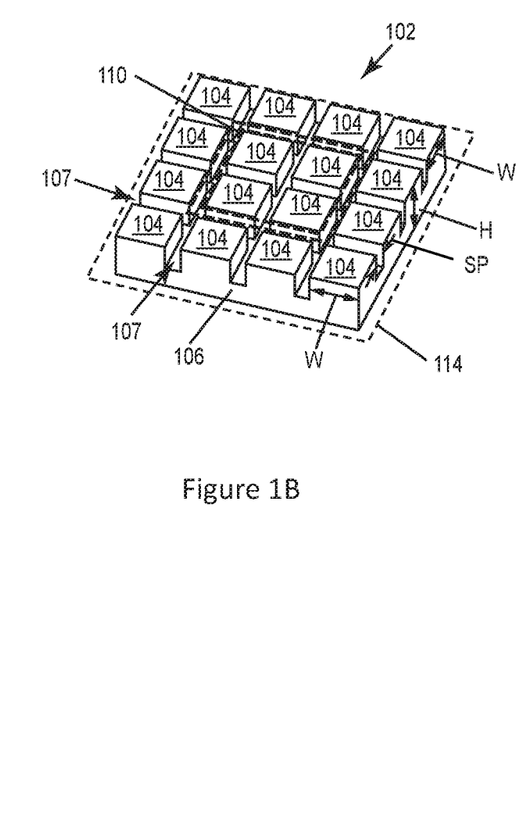
FIG. 1B shows a side perspective view of one of the lead frames.
Figure 6A:
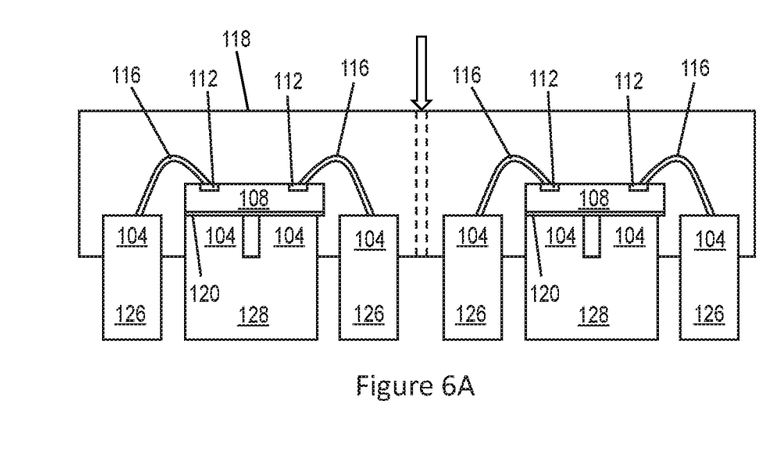
FIG. 6A illustrates a cross-sectional view of an alternative to the embodiment illustrated in FIG. 5A, after severing the common lead frame base at least between the lead frame blocks of the second group that are connected to different electric potentials or to different signals.
Figure 6B:
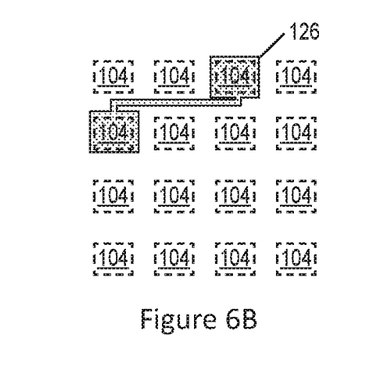
FIG. 6B illustrates a simplified bottom plan view of part of the structure shown in FIG. 6A, and in which the common lead frame base is severed such that a section/pedestal of the severed base reroutes an electrical connection between non-neighboring ones of the lead frame blocks of the second group.
Figure 6C:
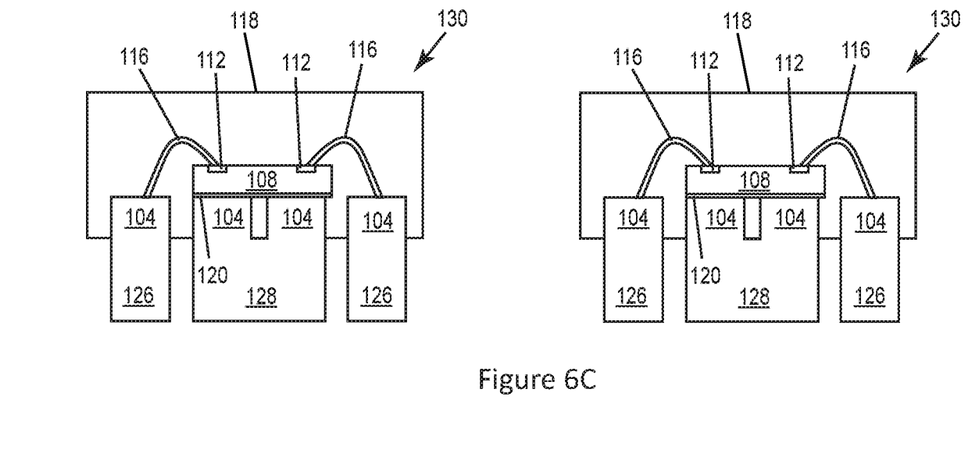
FIG. 6C illustrates a cross-sectional view through the adjacent lead frames shown in FIG. 6A, after singulation into separate semiconductor packages.

FIG. 1B shows a single lead frame 102. The lead frame 102 has blocks 104 of uniform size and that are laterally spaced apart from one another with uniform spacing. In FIG. 1B, 'W' represents a uniform lateral dimension of the blocks 104, 'H' represents a uniform vertical dimension of the blocks, and 'SP' represents uniform lateral spacing between the blocks 104. The uniform block spacing SP and the lateral dimension W of the uniform block size may be the same or may be different. In one embodiment, the uniform block spacing SP is 0.25 mm and the lateral dimension W of the uniform block size also is 0.25 mm. The uniform block spacing SP plus the lateral dimension W of the uniform block size defines a pitch of the semiconductor package to be formed from the lead frame 102. In one embodiment, the pitch (SP+W) is 0.4 mm, 0.5 mm, 0.65 mm, or 1.27 mm. The block spacing, however, does not necessarily have to directly define the package pitch, but multiples of the block spacing may define the package pitch by later structuring of the lead frame 102, e.g., as shown in FIGS. 6A-6C. For example, an internal pitch of 0.65 mm may be used within the final package while a package pitch of 0.65 mm and 1.27 mm may be realized from the same base lead frame 102 by structuring the lead frame 102 accordingly.

In one embodiment, the lead frame panel 100 with the individual lead frames 102 is formed by stamping or etching a metal sheet to form the uniformly shaped lead frame blocks 104 extending from a common base 106. Channels or grooves 107 formed by the stamping or etching process separate adjacent ones of the uniformly shaped blocks 104. The uniform block size (W, H) and uniform lateral block spacing (SP) are the same at least for individual ones of the lead frames 102, for groups of lead frames 102 or for the entire lead frame panel 100, where the uniform vertical dimension 'H' in FIG. 1B is a sum of the thickness of the common base 106 and a thickness of the uniformly shaped blocks 104. Accordingly, all of the lead frames 102 included in the same panel 100 may have the same uninform block size (W, H) and uninform lateral spacing (SP), groups of lead frames 102 may have the same uninform block size (W, H) and uninform lateral spacing (SP) which are different than one or more other groups of lead frames 102, or each individual lead frame 102 may have an uninform block size (W, H) and uninform lateral spacing (SP) that are different from the uninform block size (W, H) and uninform lateral spacing (SP) of the other lead frames 102. In each case, a plurality of molded semiconductor packages are produced from the lead frame panel 100, as shown in FIGS. 2 through 6C.

Figure 2:
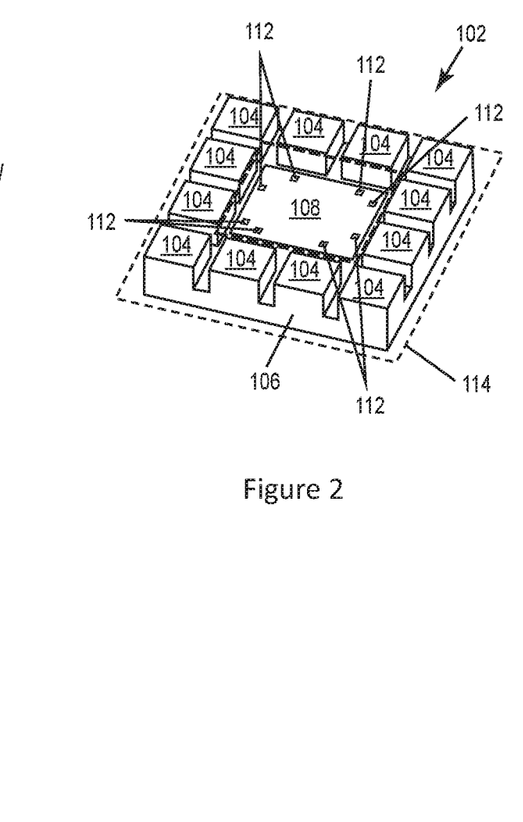
FIG. 2 illustrates a side perspective view of the individual lead frame shown in FIG. 1B after a semiconductor die is attached to a first group of the lead frame blocks.
Figure 3:
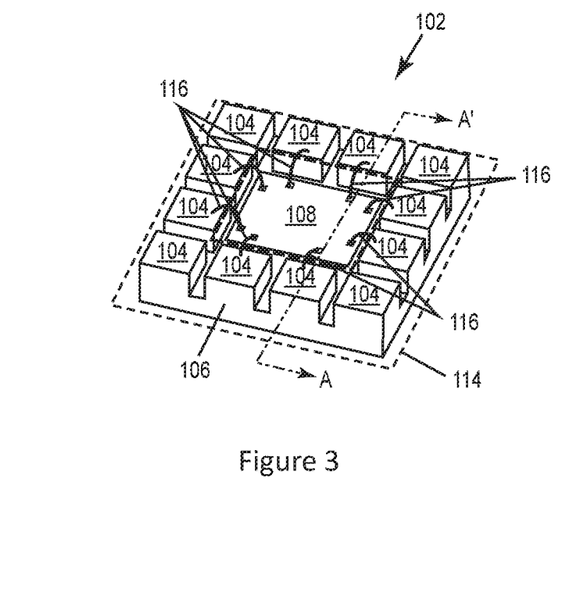
FIG. 3 illustrates a side perspective view of the individual lead frame shown in FIG. 1B with semiconductor die 108 attached thereto, after connecting I/O terminals of the semiconductor die to a second group of the lead frame blocks via electrical conductors.

For ease of illustration, FIGS. 2 and 3 show the individual lead frame 102 from FIG. 1B after further processing. FIGS. 4 through 6C show two adjacent lead frames 102 after molding and singulation. However, it should be understood that the entire lead frame panel 100 is processed in accordance with the steps illustrated in FIGS. 2 through 6C. Views of a single lead frame 102 (FIGS. 2 and 3) and two adjacent lead frames (FIGS. 4 through 6C) are provided to aid understanding of the manufacturing method without overcomplicating the presented views.

With this frame of reference, FIG. 2 illustrates the individual lead frame 102 shown in FIG. 1B after a semiconductor die 108 is attached to a first group 110 of the lead frame blocks 104. The semiconductor die 108 has input/output (I/O) terminals 112 which are separate from the power and ground terminals of the die 108. The power and ground terminals of the semiconductor die 108 are not shown in FIG. 2 for ease of illustration.

The semiconductor die 108 may be any type of power semiconductor die that includes logic circuitry. For example, the semiconductor die 108 may have 10, 20, 50 or even more I/O terminals 112 and dissipates power of at least 0.5 W up to 5 W or even more during operation. The semiconductor die 108 may be a gate driver die that includes a switch device designed to handle a large amount of current but that is not expected to be on all the time. The gate driver die may be a driver die for a half bridge or a full bridge power converter and have 10 or more I/O terminals 112, a synchronous buck driver die, a full bridge driver die, a three phase driver die, a gate driver support IC (integrated circuit) die, an automotive gate driver IC die, etc. Other examples of power semiconductor die that includes logic circuitry include, but are not limited to, small (low current) half bridges, drives for small motors and even pure logic chips having a power dissipation of at least 0.5 W up to 5 W or even more during operation such as controllers, ASICs (application-specific integrated-circuits), etc. In general, the semiconductor die 108 may or may not include logic circuitry.

The semiconductor die 108 may be a vertical device in that the primary current flow path is between one main (top/bottom) surface of the die 108 and the opposite main (bottom/top) die surface. The semiconductor die 108 instead may be a lateral device in that the primary current flow path is horizontal along the top or bottom main surface of the die 108. The semiconductor die 108 may be formed from any semiconductor material such as Si, SiC, GaN, etc. Although a single semiconductor die 108 is shown attached to the lead frame 102 in FIG. 2, more than one semiconductor die may be attached to the lead frame 102. Hence, the resulting package may be a single-die or a multi-die package.

FIG. 3 illustrates the lead frame 102 with semiconductor die 108 attached thereto, after connecting the I/O terminals 112 of the semiconductor 108 die to a second group 114 of the lead frame blocks 104 via electrical conductors 116 such as wire bonds, wire ribbons, clips, etc. One or more electrical conductors 116 may connect each I/O terminal 112 of the semiconductor die 108 to the corresponding block 104 of the lead frame 102. The uniformly shaped blocks 104 of the second group 114 are laterally spaced outward from the uniformly shaped blocks 104 of the first group 110, according to the illustrated embodiment. However, some of the uniformly shaped blocks 104 of the second group 114 may not be laterally spaced outward from the uniformly shaped blocks 104 of the first group 110, depending on the position of the semiconductor die 108 within the package.

The I/O connections between the semiconductor die 108 and the lead frame blocks 104 of the second group 114 may be provided along just the outer row of lead frame blocks 104 to aid with visual inspection, but multiple rows of lead frame blocks 104 may be included in the second group 114 for providing I/O connections to the die 108. The semiconductor die 108 may have a plating such as Ni, Ag, Pd, Au, etc. to allow wire bonding. Ball wedge wire bonding may be employed, but wedge-wedge wire bonding, soldered clips, or combinations therefore may also be used to form I/O connections between the semiconductor die 108 and the second group 114 of lead frame blocks 104. The lead frame blocks 104 may be plated on top to allow wire bonding, soldering, sintering, etc. Separately or in addition, the side of the lead frame blocks 104 the defines the package footprint may be plated, e.g., to allow board assembly.

Figure 4:
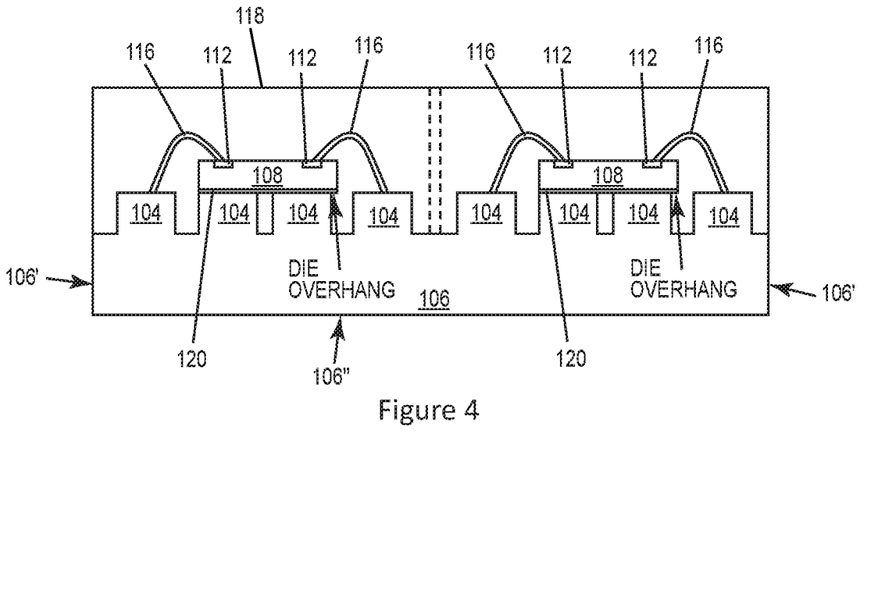
FIG. 4 illustrates a cross-sectional view through two adjacent lead frames of the lead frame panel, post die attach and after an encapsulation process.

FIG. 4 illustrates a cross-sectional view through two adjacent lead frames 102 of the lead frame panel 100, post die attach and after an encapsulation process. The cross-section is taken along the line labelled A-A' in FIG. 3. A mold compound 118 encapsulates each semiconductor die 108 and the corresponding electrical conductors 116. Any typical molding process such as injection molding, compression molding, film-assisted molding (FAM), reaction injection molding (RIM), resin transfer molding (RTM), map molding, blow molding, etc. may be used to form the mold compound 118. Common mold compounds and resins include, but are not limited to, thermoset resins, gel elastomers, encapsulants, potting compounds, composites, optical grade materials, etc. After the encapsulating, side faces 106' and a bottom side 106" of the common base 106 may be free of the mold compound 118.

As shown in FIG. 4, one or more semiconductor dies 108 may overhang one or more of the lead frame blocks 104 to which the semiconductor die 108 is attached, at one or more lateral sides of the die 108. For example, each semiconductor die 108 may be attached to the corresponding first group 110 of lead frame blocks 104 via a die attach material 120 such as solder, an adhesive, sinter material, die attach film (DAF), etc. and such that the die 108 overhangs one or more blocks 104 of the first group 110. Each semiconductor die 108 may cover more than one lead frame block 104. Preferably, the semiconductor dies 108 do not contact lead frame blocks 104 designated as I/O terminals. However, an insulating glue or similar material may be used to secure a semiconductor die 108 to one or more lead frame blocks 104 designated as I/O terminals. FIG. 4 also shows a dicing or singulation street, illustrated as a dashed rectangle, and along which individual ones of the packages are cut to singulate or physically divide the packages.

Figure 5A:
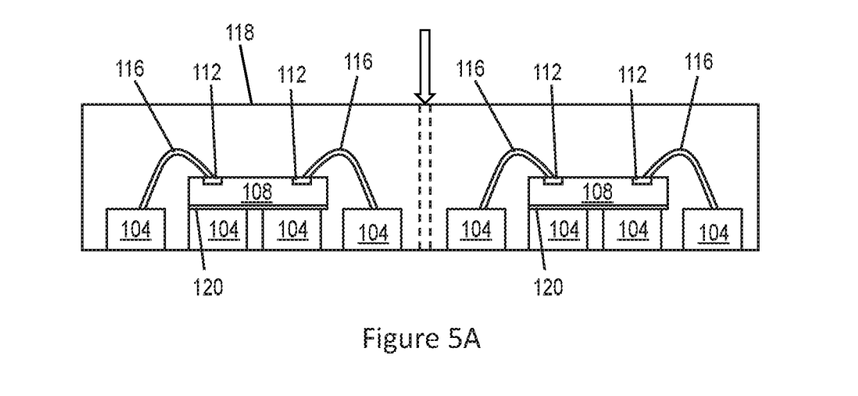
FIG. 5A illustrates a cross-sectional view through the adjacent lead frames shown in FIG. 4, after removing a common base of the lead frames.

FIG. 5A illustrates a cross-sectional view through the adjacent lead frames 102 shown in FIG. 4, after removing the common base 106 of the lead frames 102. The common base 106 of the lead frames 102 may be removed by, e.g., unstructured etching, grinding, and/or milling of the common base 106.

Figure 5B:
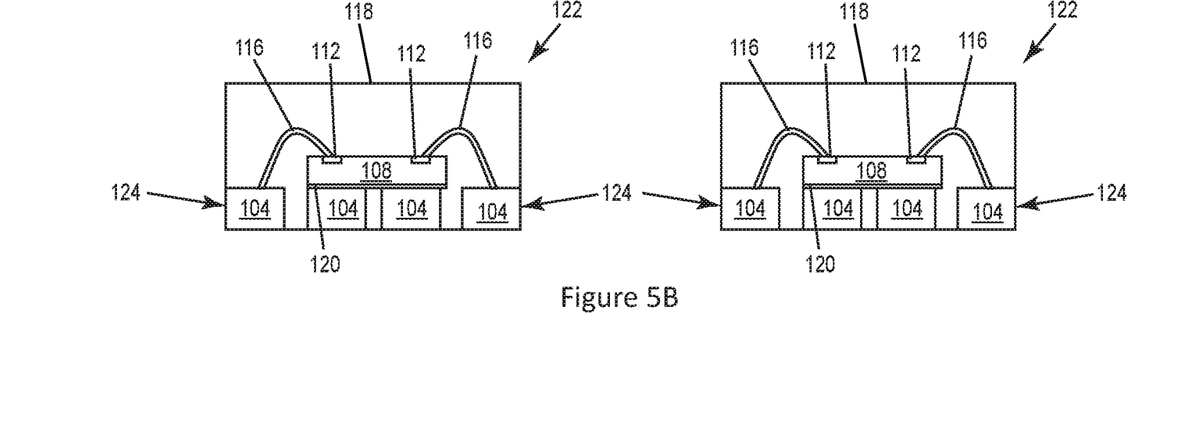
FIG. 5B illustrates a cross-sectional view through the adjacent lead frames shown in FIG. 5A, after singulation into separate semiconductor packages.

FIG. 5B illustrates a cross-sectional view through the adjacent lead frames 102 shown in FIG. 5A, after singulation into separate semiconductor packages 122 along the dicing/singulation streets, as indicated by the downward facing arrow in FIG. 5A, and after removing the mold compound 118 from exterior side faces 124 of the lead frame blocks 104 disposed along the periphery of each singulated semiconductor package 122. The package singulation and mold compound removal may be performed in a single step or successive steps. In the case of a single step, the dicing/singulation street indicated by the downward facing arrow in FIG. 5A may be wide enough such that the width of the dicing blade is slightly larger than the lead frame block spacings. According to this approach, the width of the lead frame blocks adjacent the dicing/singulation streets are reduced only by a small amount, but the mold compound 118 is removed entirely between the adjacent lead frame blocks 104. According to another embodiment, a thin blade without open metal flanks may be used for package singulation.

The semiconductor packages 122 may be singulated by laser cutting, saw cutting, etc. The mold compound 118 may be removed from the from exterior side faces 124 of the lead frame blocks 104 disposed along the periphery of each singulated semiconductor package 122 by running a saw blade along the outer row of lead frame blocks 104 of each package 122. For example, the outer row of lead frame blocks 104 of each package 122 may be contacted by half of the dicing blade to clear the mold compound 118 in this region and thereby allow for lateral visual inspection of the package I/O connections formed by the outermost lead frame blocks 104 of the respective packages 122. The total package size is reduced by one full dicing blade width (e.g. typically about 100 μm), but the pitch of the packages 122 does not change. However, the outside row of lead frame blocks 104 is smaller in one dimension.

FIG. 6A, which illustrates an alternative to the embodiment illustrated in FIG. 5A, shows a cross-sectional view through the adjacent lead frames 102 in FIG. 4 after severing the common lead frame base 106 at least between the lead frame blocks 104 of the second group 114 that are connected to different electric potentials or to different signals. This way, different signal connections and/or different electric potentials are not inadvertently shorted together.

In one embodiment, the common lead frame base 106 is severed by structured etching of the common base 106 to form pedestals 126, 128 that are laterally spaced apart from one another. Each pedestal 126, 128 remains integrally connected to one or more of the lead frame blocks 104. For example, the lead frame blocks 104 of the second group 114 that are connected to different electric potentials or to different signals are integrally connected to different ones of the pedestals 126 to provide electrical isolation. The lead frame blocks 104 of the second group 114 that are connected to the same electric potential or to the same signal may be integrally connected to the same pedestal 126. The lead frame blocks 104 of the first group 110 may be integrally connected to the same pedestal 128. Structured etching of the common lead frame base 106 to form the spaced apart pedestals 126, 128 may be implemented by masked chemical etching, directed laser etching, targeted sawing, milling, etc.

The common lead frame base 106 may be severed such that a section/pedestal 126 of the severed base 106 reroutes one or more connections between non-neighboring ones of the lead frame blocks 104 of the second group 114. This allows for coupling different ones of the lead frame blocks 104 to the same potential, e.g., ground. This re-routing feature also allows for altering the effective package terminal layout without requiring a lead frame re-design. Re-routing may also be achieved by bonding wires, ribbons, etc. from one lead frame block 104 to another lead frame block 104.

FIG. 6B illustrates a simplified bottom plan view of part of the structure shown in FIG. 6A, and in which the common lead frame base 106 is severed such that one of the sections/pedestals 126 of the severed base 106 reroutes an electrical connection between non-neighboring ones of the lead frame blocks 104 of the second group 114. The other sections/pedestals 126, 128 of the severed common lead frame base 106 are not shown in FIG. 6B for ease of illustration. Additional interconnections may be formed between non-neighboring ones of the lead frame blocks 104 of the second group 114 by severing the common base 106 into corresponding pedestal sections.

FIG. 6C illustrates a cross-sectional view through the adjacent lead frames 102 shown in FIG. 6A, after singulation into separate semiconductor packages 130 along the dicing/singulation streets, as indicated by the downward facing arrow in FIG. 6A. The semiconductor packages 130 may be singulated by laser cutting, saw cutting, etc. The pedestals 126, 128 formed by severing the common lead frame base 106 are free from the mold compound 118 and provide a positive standoff for the semiconductor packages 130 when mounting to another structure such as a circuit board.

In some figures, the semiconductor die 108 is shown positioned in the middle or center location of the package with pads all around the die 108. However, the semiconductor die 108 may be positioned at an edge or corner region of the package with pads at 3, 2, or even one side of the die 108.

The width of the lead frame blocks 104 does not have to be the same as the width of the corresponding pedestals 126, 128. For example, the lead frame blocks 104 may have an overhang on either side. The height of the lead frame blocks may be roughly the height of the base (half etch), but may differ in both directions.

Although the present disclosure is not so limited, the following numbered examples demonstrate one or more aspects of the disclosure.

Example 1. A semiconductor package, comprising: a lead frame comprising a plurality of blocks of uniform size and laterally spaced apart from one another with uniform spacing; a first semiconductor die attached to a first group of the blocks; electrical conductors connecting a plurality of input/output (I/O) terminals of the first semiconductor die to a second group of the blocks, at least some blocks of the second group being laterally spaced outward from the blocks of the first group; and a mold compound encapsulating the first semiconductor die and the electrical conductors.

Example 2. The semiconductor package of example 1, wherein the uniform size and the uniform spacing are the same.

Example 3. The semiconductor package of example 1 or 2, wherein the uniform spacing defines an internal pitch within the semiconductor package, and wherein the semiconductor package has a different pitch than the internal pitch.

Example 4. The semiconductor package of any of examples 1 through 3, wherein the uniform size plus the uniform spacing defines a pitch of the semiconductor package, and wherein the pitch is 0.4 mm, 0.5 mm, 0.65 mm, or 1.27 mm.

Example 5. The semiconductor package of any of examples 1 through 4, wherein the first semiconductor die overhangs one or more of the blocks to which the first semiconductor die is attached.

Example 6. The semiconductor package of any of examples 1 through 5, wherein the lead frame further comprises a base from which the blocks extend in a direction perpendicular to the lateral spacing between the blocks, and wherein the base is severed at least between the blocks of the second group that are connected to different electric potentials or to different signals to provide electrical isolation.

Example 7. The semiconductor package of example 6, wherein the blocks of the first group are interconnected by the base.

Example 8. The semiconductor package of example 6 or 7, wherein the blocks of the second group that are connected to the same electric potential or to the same signal are interconnected by the base.

Example 9. The semiconductor package of any of examples 6 through 8, wherein the blocks of the second group that are disposed in corner regions of the semiconductor package are interconnected by the base.

Example 10. The semiconductor package of any of examples 6 through 9, wherein the base is severed such that a section of the severed base reroutes one or more connections between non-neighboring ones of the blocks of the second group.

Example 11. The semiconductor package of any of examples 1 through 10, wherein the first semiconductor die is a driver die for a half bridge or a full bridge power converter, and wherein the driver die has 10 or more I/O terminals.

Example 12. A method of producing a semiconductor package, the method comprising: providing a lead frame comprising a common base and a plurality of blocks of uniform size and laterally spaced apart from one another with uniform spacing, the blocks extending from the common base in a direction perpendicular to the lateral spacing between the blocks; attaching a first semiconductor die to a first group of the blocks; connecting a plurality of input/output (I/O) terminals of the first semiconductor die to a second group of the blocks, at least some blocks of the second group being laterally spaced outward from the first group of blocks; encapsulating the first semiconductor die and the connections between the I/O terminals and the second group of blocks in a mold compound; and after the encapsulating, removing the common base of the lead frame or severing the common base at least between the blocks of the second group that are connected to different electric potentials or to different signals.

Example 13. The method of example 12, wherein the lead frame is part of a lead frame panel, and wherein a plurality of molded semiconductor packages are produced from the lead frame panel.

Example 14. The method of example 12 or 13, wherein providing the lead frame comprises: stamping or etching a metal sheet to form the blocks extending from the common base such that the uniform size of the blocks and the uniform spacing between the blocks are the same.

Example 15. The method of any of examples 12 through 14, wherein attaching the first semiconductor die to the first group of blocks comprises: joining the first semiconductor die to the first group of blocks via a die attach material and such that the first semiconductor die overhangs one or more blocks of the first group.

Example 16. The method of any of examples 12 through 15, wherein removing the common base of the lead frame comprises: unstructured etching, grinding, or milling of the common base.

Example 17. The method of example 16, further comprising: removing the mold compound from exterior side faces of the blocks disposed along a periphery of the semiconductor package.

Example 18. The method of any of examples 12 through 17, wherein severing the common base at least between the blocks of the second group that are connected to different electric potentials or to different signals comprises: structured etching of the common base to form pedestals that are laterally spaced apart from one another, wherein each pedestal remains integrally connected to one or more of the blocks.

Example 19. The method of example 18, wherein after the encapsulating, side faces and a bottom side of the common base are free of the mold compound, and wherein after the severing, the pedestals are free from the mold compound and provide a positive standoff for the semiconductor package.

Example 20. The method of example 18 or 19, wherein the blocks of the second group that are connected to different electric potentials or to different signals are integrally connected to different ones of the pedestals to provide electrical isolation.

Example 21. The method of any of examples 18 through 20, wherein the blocks of the second group that are connected to the same electric potential or to the same signal are integrally connected to the same pedestal.

Example 22. The method of any of examples 18 through 21, wherein the blocks of the first group are integrally connected to the same pedestal.

Example 23. The method of any of examples 12 through 22, further comprising: severing the common base such that a section of the severed base reroutes one or more connections between non-neighboring ones of the blocks of the second group.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a lead frame comprising a plurality of blocks of uniform size and laterally spaced apart from one another with uniform spacing;
   a first semiconductor die attached to a first group of the blocks;
   electrical conductors connecting a plurality of input/output (I/O) terminals of the first semiconductor die to a second group of the blocks, at least some blocks of the second group being laterally spaced outward from the blocks of the first group; and
   a mold compound encapsulating the first semiconductor die and the electrical conductors.

2. The semiconductor package of claim 1, wherein a lateral dimension of the blocks and the uniform spacing are the same.

3. The semiconductor package of claim 1, wherein the uniform spacing defines an internal pitch within the semiconductor package, and wherein the semiconductor package has a different pitch than the internal pitch.

4. The semiconductor package of claim 1, wherein the uniform size plus the uniform spacing defines a pitch of the semiconductor package, and wherein the pitch is 0.4 mm, 0.5 mm, 0.65 mm, or 1.27 mm.

5. The semiconductor package of claim 1, wherein the first semiconductor die overhangs one or more of the blocks to which the first semiconductor die is attached.

6. The semiconductor package of claim 1, wherein the lead frame further comprises a base from which the blocks extend in a direction perpendicular to the lateral spacing between the blocks, and wherein the base is severed at least between the blocks of the second group that are connected to different electric potentials or to different signals to provide electrical isolation.

7. The semiconductor package of claim 6, wherein the blocks of the first group are interconnected by the base.

8. The semiconductor package of claim 6, wherein the blocks of the second group that are connected to the same electric potential or to the same signal are interconnected by the base.

9. The semiconductor package of claim 6, wherein the blocks of the second group that are disposed in corner regions of the semiconductor package are interconnected by the base.

10. The semiconductor package of claim 6, wherein the base is severed such that a section of the severed base reroutes one or more connections between non-neighboring ones of the blocks of the second group.

11. The semiconductor package of claim 1, wherein the first semiconductor die is a driver die for a half bridge or a full bridge power converter, and wherein the driver die has 10 or more I/O terminals.

12. A method of producing a semiconductor package, the method comprising:
providing a lead frame comprising a common base and a plurality of blocks of uniform size and laterally spaced apart from one another with uniform spacing, the blocks extending from the common base in a direction perpendicular to the lateral spacing between the blocks;
attaching a first semiconductor die to a first group of the blocks;
connecting a plurality of input/output (I/O) terminals of the first semiconductor die to a second group of the blocks, at least some blocks of the second group being laterally spaced outward from the first group of blocks;
encapsulating the first semiconductor die and the connections between the I/O terminals and the second group of blocks in a mold compound; and
after the encapsulating, removing the common base of the lead frame or severing the common base at least between the blocks of the second group that are connected to different electric potentials or to different signals.

13. The method of claim 12, wherein the lead frame is part of a lead frame panel, and wherein a plurality of molded semiconductor packages are produced from the lead frame panel.

14. The method of claim 12, wherein providing the lead frame comprises:
stamping or etching a metal sheet to form the blocks extending from the common base such that a lateral dimension of the blocks and the uniform spacing between the blocks are the same.

15. The method of claim 12, wherein attaching the first semiconductor die to the first group of blocks comprises:
joining the first semiconductor die to the first group of blocks via a die attach material and such that the first semiconductor die overhangs one or more blocks of the first group.

16. The method of claim 12, wherein removing the common base of the lead frame comprises:
unstructured etching, grinding, or milling of the common base.

17. The method of claim 16, further comprising:
removing the mold compound from exterior side faces of the blocks disposed along a periphery of the semiconductor package.

18. The method of claim 12, wherein severing the common base at least between the blocks of the second group that are connected to different electric potentials or to different signals comprises:
structured etching of the common base to form pedestals that are laterally spaced apart from one another,
wherein each pedestal remains integrally connected to one or more of the blocks.

19. The method of claim 18, wherein after the encapsulating, side faces and a bottom side of the common base are free of the mold compound, and wherein after the severing, the pedestals are free from the mold compound and provide a positive standoff for the semiconductor package.

20. The method of claim 18, wherein the blocks of the second group that are connected to different electric potentials or to different signals are integrally connected to different ones of the pedestals to provide electrical isolation.

21. The method of claim 18, wherein the blocks of the second group that are connected to the same electric potential or to the same signal are integrally connected to the same pedestal.

22. The method of claim 18, wherein the blocks of the first group are integrally connected to the same pedestal.

23. The method of claim 12, further comprising:
severing the common base such that a section of the severed base reroutes one or more connections between non-neighboring ones of the blocks of the second group.

* * * * *